United States Patent [19]
Gardner et al.

[11] Patent Number: 6,027,976
[45] Date of Patent: Feb. 22, 2000

[54] PROCESS FOR MAKING SEMICONDUCTOR DEVICE HAVING NITRIDE AT SILICON AND POLYSILICON INTERFACES

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/056,963

[22] Filed: Apr. 8, 1998

Related U.S. Application Data

[63] Continuation-in-part of application No. 08/993,414, Dec. 18, 1997, Pat. No. 5,963,810.

[51] Int. Cl.[7] .................................................. H01L 21/336
[52] U.S. Cl. ........................................... 438/287; 361/305
[58] Field of Search ..................................... 438/287, 243, 438/288, 286, 242, 653; 361/305, 303; 257/306

[56] References Cited

U.S. PATENT DOCUMENTS 5,913,118  12/1997  Wu ........................................... 438/243

*Primary Examiner*—Charles Bowers
*Assistant Examiner*—Craig Thompson

[57] ABSTRACT

A semiconductor device having a gate insulating layer that includes a high permittivity layer between thin nitride layers. A first nitride layer formed on a silicon substrate to control unwanted oxidation of the substrate. A high permittivity layer is deposited on the first nitride layer, and a second nitride layer deposited on the permittivity layer. A gate electrode is formed on the second nitride layer. The second nitride layer prevents oxidation of the gate electrode from the high permittivity layer.

10 Claims, 2 Drawing Sheets

PROCESS FOR MAKING SEMICONDUCTOR DEVICE HAVING NITRIDE AT SILICON AND POLYSILICON INTERFACES

RELATED APPLICATIONS

This application is a continuation-in-part of U.S. patent application Ser. No., 08/993,414, U.S. Pat. No. 5,963,810, filed on Dec. 18, 1997, by Gardner et al.

FIELD OF THE INVENTION

The present invention is directed generally to semiconductor devices and, more particularly, to a semiconductor device having a gate insulating layer that includes thin, protective nitride layers and a process for fabrication such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 103, which acts as a conductor, to which an input signal is typically applied via a gate terminal (not shown). Heavily doped source/drain regions 105 are formed in a semiconductor substrate 101 and are respectively connected to source and drain terminals (not shown). A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is physically separated from the semiconductor substrate 101 by a gate insulating layer 109, typically an oxide layer such as $SiO_2$. The insulating layer 109 is provided to prevent current from flowing between the gate electrode 103 and the source/drain regions 105 or channel region 109.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region/drain regions 105. In this manner an electric field controls the current flow through the channel region 107. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate ever increasing numbers of such devices into a single silicon wafer. As the semiconductor devices are scaled down (i.e., made smaller) and in order to form a larger number of devices on a given surface area, the structure of the devices and fabrication techniques used to make such devices must be altered.

One important step in the manufacture of MOS devices is the formation of the gate insulating layer. The gate insulating layer is typically formed by growing an oxide, typically $SiO_2$, over the surface of the substrate 101. It is important to carefully control the growth of the gate oxide layer because the thickness and uniformity of the gate oxide layer can significantly impact the overall operation of the device being formed. For example, the drive current in a MOS transistor is inversely proportional to the gate oxide thickness at a given set of terminal voltages. Accordingly, it is normally desired to increase the drive current of the transistor by making the gate oxide as thin as possible, taking into consideration the oxide breakdown and reliability considerations of the process and technology being used.

The above described conventional techniques for forming gate oxide layers impose limitations on the minimum thickness of the gate oxide layer and on the ability to control the uniformity of the gate oxide layer. As the thresholds for minimum thickness and uniformity control are reached, the ability to further scale down the semiconductor devices is hindered.

SUMMARY OF THE INVENTION

Generally, the present invention relates to a semiconductor device having a gate insulating layer that includes nitride layers at the silicon and poly-silicon interfaces and a process for manufacturing such a device. The nitride layers can, for example, reduce oxidation of a high permittivity layer and increase the ability to control the characteristics of the gate insulating layer. In addition, the nitride layers inhibit undesired oxidation of the substrate of the semiconductor device.

In one embodiment, the invention is a semiconductor device having a gate insulating layer that includes a high permittivity layer between thin nitride layers. A first nitride layer formed on a silicon substrate to control unwanted oxidation of the substrate. A high permittivity layer is deposited on the first nitride layer, and a second nitride layer deposited on the permittivity layer. A gate electrode is formed on the second nitride layer. The second nitride layer prevents oxidation of the gate electrode from the high permittivity layer.

In another embodiment, the invention is a method for making a semiconductor device. The method comprises the steps of: forming a silicon substrate; depositing on the substrate a first nitride layer having a first selected thickness; etching the first nitride layer sufficient to reduce the first selected thickness to a second selected thickness; forming a high permittivity layer on the first nitride layer; depositing on the permittivity layer a second nitride layer having a third selected thickness; etching the second nitride layer sufficient to reduce the third selected thickness to a fourth selected thickness; forming a gate electrode on the second nitride layer; and masking and etching the gate electrode, second nitride layer, permittivity layer, and first nitride layer to form a gate structure.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 2F:
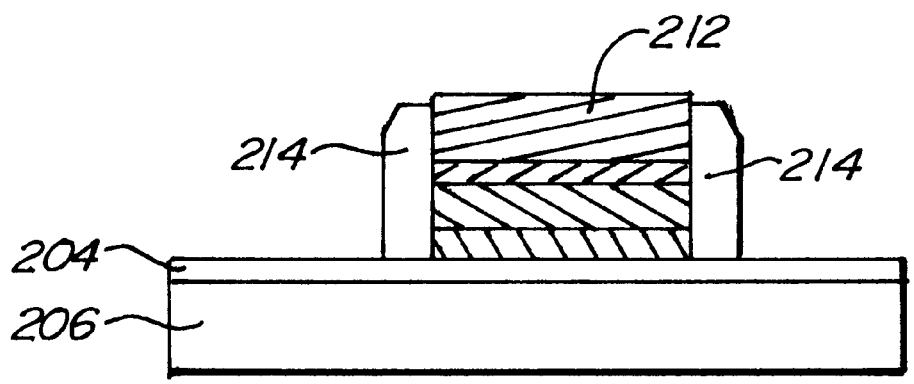
FIGS. 2A–2F illustrate an example fabrication process for a semiconductor device in accordance with various embodiments of the invention.
Figure 1:
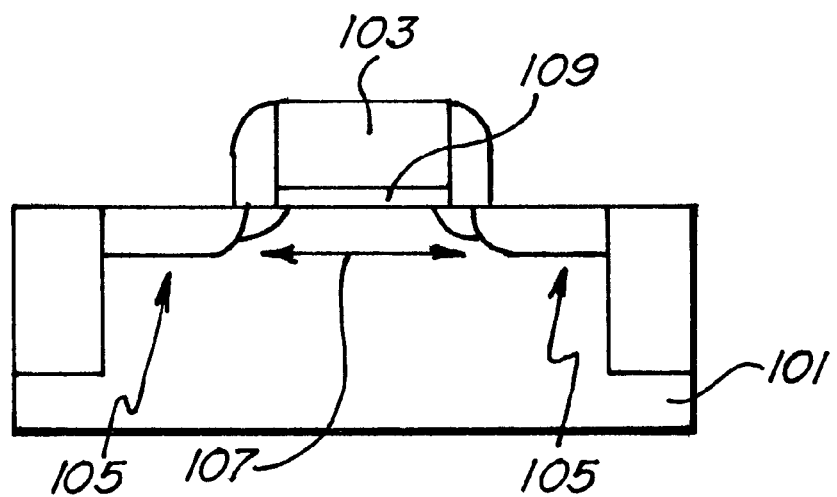
FIG. 1 illustrates a conventional MOS device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a number of semiconductor devices which have a gate electrode disposed on a gate insulating layer. The invention has been found to be particularly advantageous in applications where it is desirable to form a gate insulating layer used in a MOS device, such as a PMOS, NMOS, CMOS, or BiCMOS device. While the present invention is not so limited, an appreciation of various aspects of the invention is best gained through a discussion of various application examples of processes used to form such semiconductor devices.

Generally, the example processes discussed below illustrate a variety of techniques for forming a semiconductor device having a high permittivity gate insulating layer along with thin, protective nitride layers. Nitride layers in combination with a high permittivity material to form a gate insulating layer provide improved performance and reliability. FIGS. 2A through 2F illustrate a fabrication process in accordance with an embodiment of the invention in which a high permittivity gate insulating layer is formed using nitride layers at the silicon and poly-silicon interfaces.

Figure 2A:
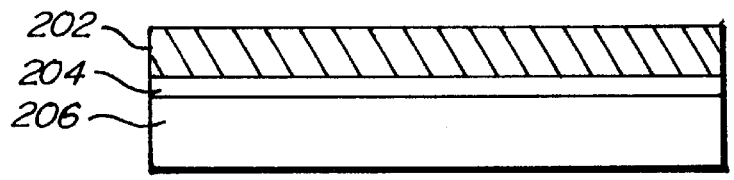

In FIG. 2A, a nitride layer 202 is formed over an oxidized layer 204 on a silicon substrate 206. Conventional processes are used to construct substrate 206 having oxidation layer 204. It will be appreciated that oxide layer 204 could be, in an alternate embodiment an oxynitride layer. The nitride layer 202 is formed, for example, using a sputter deposition process. Sputtering nitride typically involves making a plasma solution of nitrogen gas to provide ionized nitrogen atoms, accelerating the atoms toward a silicon target, thereby depositing the silicon nitride byproduct on the surface of the substrate. The sputtered deposition process advantageously provides a very slow deposition rate and allows for enhanced control over the thickness of the deposition silicon nitride layer 202. Moreover, the sputter nitride deposition process is typically a room temperature process. For example, the chamber used in the sputtering process operates at room temperature and at about 10E-8 torr core pressure.

Figure 2B:
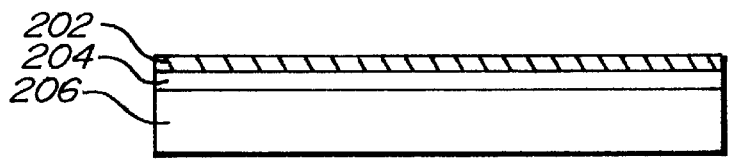

The use of a sputter deposition process described above allows for relatively thin layer of nitride to be deposited. Using the sputter deposition technique, nitride layer thicknesses ranging from about 5 to 15 Å may be provided. While sputter deposition of the nitride layer provides a relatively thin layer, an even thinner layer is desirable to keep the profile of the gate to a desired minimum. As shown in FIG. 2B, the nitride layer 202 is etched back to approximately 1 to 3 Å. The etching back of the nitride layer 202 is accomplished using a 100:1 HF solution.

Figure 2C:
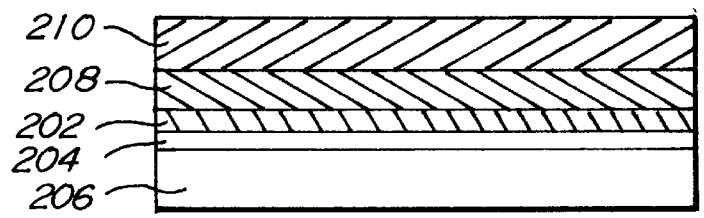

A high permittivity layer 208 is formed over the thin nitride layer 202, as illustrated in FIG. 2C. The high permittivity layer 208 may be formed from a number of different materials as provided below, wherein the dielectric constant (i.e., permittivity) of the high permittivity gate insulating layer varies depending on the type of material used. The dielectric constant of the high permittivity gate insulating layer is typically greater than that of silicon dioxide (dielectric constant of about 4.2) which is normally used to form conventional gate insulating layers. Such high permittivity materials include, for example, barium strontium titanate (BST) ($Ba_{1-x}Sr_xO_3$) having dielectric constant between about 20 to 200, tantalum oxide ($Ta_xO_y$) having a dielectric constant ranging from about 20 to 200, lead zinc niobate (PZN) ($PbZn_xNb_{1-x}O_3$) having a dielectric constant of about 7,333 where x=J and lead scandium tantalum oxide (PST) ($PbSc_xTa_{1-x}O_3$) having a dielectric constant of about 3,000 where x=½. It will be appreciated that the dielectric constant values given above are approximate only and can vary with the process techniques used to form and measure the permittivity of the materials. A more detailed discussion of the formation of gate insulating layers using relatively high permittivity materials and the types of high permittivity materials which may be used are provided in U.S. patent application Ser. No. 08/920,384, entitled "Semiconductor Device Having High Permittivity Gate Insulating Layer And Method Of Manufacturing Thereof," filed Aug. 29, 1997, the contents of which are herein incorporated by reference.

In one particular embodiment, the high permittivity layer 208 is formed using a conventional sputter deposition process. The thickness of the high permittivity layer 208 is selected in consideration of the desired characteristics of the insulative layers as well as in consideration of reliability concerns. Example thicknesses range from about 100 to 3000 Å. While these thicknesses are substantially thicker than present $SiO_2$ gate oxide thicknesses, it will be appreciated that the equivalent $SiO_2$ thickness of the high permittivity gate insulating layer 203 can be lower than conventional $SiO_2$ gate insulating layers. For example, 100 Å of a tantalum oxide ($Ta_xO_y$) having a dielectric constant of about 25 is equivalent to 4.0 Å of silicon dioxide having a dielectric constant of 4.2.

A nitride capping layer 210 is formed over the high permittivity layer 208 prior to forming the gate electrode layer. The use of nitride capping layer 210 is particularly advantageous when the gate electrode layer is formed from silicon (e.g., poly-silicon or amorphous silicon) as the nitride capping layer can, for example prevent subsequent oxidation of the silicon gate electrode layer by the high permittivity layer 208. The nitride capping layer 210 may also enhance device performance by inhibiting the diffusion of dopants used to dope the silicon gate electrode layer into the high permittivity layer 208.

The nitride capping layer 210 can be formed, for example, using well-known jet vapor deposition technicnies. In another embodiment, a nitride capping layer is formed in-situ with the high permittivity layer 208. The in-situ deposition of the nitride capping layer 210 with the previously formed high permittivity layer 208 typically involves purging the sputter deposition chamber and changing the plasma solution to a nitrogen plasma solution and changing the sputter deposition target to a silicon target. Advantageously, the in-situ sputter deposition of the nitride capping layer 210, high permittivity layer 208 allows for near room temperature processing which further inhibits the ability of the high permittivity layer 208 to oxidize.

Figure 2D:
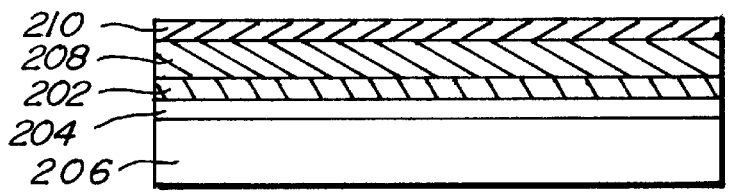

The thickness of the nitride capping layer 210 is minimized by etching back the layer in the same manner as described above for nitride layer 202, as illustrated in FIG. 2D. While, a sputtered nitride layer advantageously allows controllable and thin nitride layers to be formed, etching back the nitride capping layer 210 to approximately 2 to 5 Å provides the advantages cited above while keeping the gate profile to a minimum.

Figure 2E:
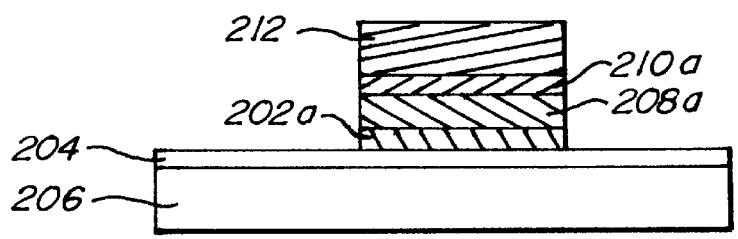

A gate electrode 212 is then constructed by forming a gate electrode layer (not shown) over the nitride capping layer 208 and then removing selected portions of the gate electrode layer, the nitride capping layer 210, high permittivity layer 208, and nitride layer 202. The resultant structure is illustrated in FIG. 2E. The gate electrode layer is formed, for example, by depositing poly-silicon, amorphous silicon, or a metal (e.g., tungsten or copper) using known techniques. The thickness of the gate electrode layer is selected in consideration of the desired thickness of the gate electrode/high permittivity gate insulating layer stack. Example poly-silicon or amorphous silicon thicknesses can range from about 200 to 3000 Å, while metal thickness are generally somewhat less.

Removal of the gate electrode layer is performed, for example, using known etching techniques. Typically, the formation of the gate electrode 212 involves removal of portions of the high permittivity gate insulating layer 208 from active regions of the substrate 206 adjacent the gate electrode 212. Removal of portions of the high permittivity layer 208 may, for example, be performed using known etching techniques such as plasma etching. Portions of nitride layers 210 and 202 can be removed by plasma etching or wet etching.

Fabrication continues with well-known processes, such as spacer 214 formation (FIG. 2F), source/drain implants (not shown), silicidation, and contact formation to form the ultimate device structure.

In accordance with embodiments of the invention, a gate insulating layer is formed with a high permittivity layer between thin nitride layers. This provides a robust gate insulating layer with reduced equivalent silicon dioxide thicknesses. In particular, the lower nitride layer 202 provides a receptive surface on which the high permittivity layer 208 is disposed. The upper nitride layer 210 provides additional advantages. When used with a poly-silicon gate electrode, the upper nitride layer 210 tends to inhibit oxidation of the gate electrode during subsequent processing. The upper layer 210 also inhibits the penetration of a doping agent (such as boron) into and through the high permittivity layer 208. This increases the reliability and performance of the gate insulating layer.

The nitride layer portions 202a and 210a of the gate insulating layer improve the reliability and characteristics of the resulting semiconductor device. For example, capping nitride layer 210a inhibits oxidation of the high permittivity layer 208a during subsequent processing (e.g., during the source/drain anneal). Moreover, nitride layer 202a between the high permittivity layer 208a and the substrate 206 inhibits further oxidation of the substrate.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A method for manufacturing a semiconductor device, comprising the steps of:

forming a silicon substrate;

depositing on the substrate a first nitride layer having a first selected thickness;

etching the first nitride layer sufficient to reduce the first selected thickness to a second selected thickness;

forming a high permittivity layer on the first nitride layer;

depositing on the permittivity layer a second nitride layer having a third selected thickness;

etching the second nitride layer sufficient to reduce the third selected thickness to a fourth selected thickness;

forming a gate electrode on the second nitride layer; and masking and etching the gate electrode, second nitride layer, permittivity layer, and first nitride layer to form a gate structure.

2. The method of claim 1, wherein the first nitride layer is etched to between approximately 1 to 3 Å thick.

3. The method of claim 2, wherein the second nitride layer is etched to between approximately 2 to 5 Å thick.

4. The method of claim 3, wherein the permittivity layer has a dielectric constant of approximately 50.

5. The method of claim 3, wherein the permittivity layer is deposited to between approximately 2 to 10 Å thick.

6. The method of claim 1, wherein the permittivity layer has a dielectric constant of approximately 300.

7. The method of claim 1, further comprising the step of forming an oxide layer between the first nitride layer and the substrate.

8. The method of claim 1, further comprising the step of forming an oxynitride layer between the first nitride layer and the substrate.

9. The method of claim 1, wherein the gate electrode is formed from poly-silicon material.

10. The method of claim 1, wherein the permittivity layer is formed from one of the group of barium strontium titanate, tantalum oxide, lead zinc niobate, or lead scandium tantalum oxide.

* * * * *

UNITED STATES PATENT AND TRADEMARK OFFICE
CERTIFICATE OF CORRECTION

PATENT NO. : 6,027,976

DATED : February 22, 2000

INVENTOR(S): Mark I. Gardner and Mark C. Gilmer

It is certified that error appears in the above-identified patent and that said Letters Patent is hereby corrected as shown below:

On the title page: Item [54] and Column 1, line 3,

The title should read, "PROCESS FOR MAKING SEMICONDUCTOR DEVICE HAVING NITRIDE LAYERS AT SILICON AND POLYSILICON INTERFACES".

Col. 4, line 48: "technicnies" should read --techniques--.

Signed and Sealed this

Twentieth Day of February, 2001

*Attest:*

NICHOLAS P. GODICI

*Attesting Officer*     *Acting Director of the United States Patent and Trademark Office*